United States Patent [19]

Bratter et al.

[11] 3,886,000

[45] May 27, 1975

[54] METHOD FOR CONTROLLING DIELECTRIC ISOLATION OF A SEMICONDUCTOR DEVICE

[75] Inventors: Robert L. Bratter, Mahopac; Arun K. Gaind, Fishkill, both of N.Y.

[73] Assignee: IBM Corporation, Armonk, N.Y.

[22] Filed: Nov. 5, 1973

[21] Appl. No.: 413,095

[52] U.S. Cl. .................... 148/175; 29/578; 29/580; 117/62; 117/106 A; 117/201; 117/215; 148/174; 148/187; 357/49; 357/50

[51] Int. Cl. .......................... H01l 7/36; H01l 27/12

[58] Field of Search .................... 148/174, 175, 187; 117/106 A, 201, 62, 215; 317/235 E, 235 F; 29/578, 580; 357/49, 50

[56] References Cited

UNITED STATES PATENTS

| | | | |
|---|---|---|---|
| 3,442,011 | 5/1969 | Strieter | 29/578 |
| 3,558,348 | 1/1971 | Rand | 117/106 A |
| 3,648,125 | 3/1972 | Peltzer | 317/235 F |
| 3,657,030 | 4/1972 | Porter | 117/106 A |
| 3,755,001 | 8/1973 | Kooi et al. | 148/175 X |
| 3,784,847 | 1/1974 | Kurz et al. | 317/235 F |
| 3,793,090 | 2/1974 | Barile et al. | 117/201 |

OTHER PUBLICATIONS

Franz et al., "Conversion of Silicon Nitride...Oxygen" Solid-State Electronics, Vol. 14, 1971, pp. 499–505

Appels et al., "Local Oxidation of Silicon...Technology" Philips Res. Repts., 25, April, 1970, pp. 118–132.

"Locos-The New Layer Cake Mix" Scientific American, July 1971, p. 11.

*Primary Examiner*—L. Dewayne Rutledge
*Assistant Examiner*—W. G. Saba
*Attorney, Agent, or Firm*—Frank C. Leach, Jr.; J. B. Kraft

[57] ABSTRACT

A dielectric isolation barrier is formed in a silicon substrate by oxidizing openings formed in an epitaxial layer on the substrate and a layer of silicon oxynitride ($SiO_xN_y$), which is on the surface of the epitaxial layer of the substrate. During this oxidation of the openings, the layer of silicon oxynitride is thermally oxidized to form an electrically insulating layer of silicon dioxide on the surface of the epitaxial layer and homogeneous with the silicon dioxide of the dielectric isolation barrier. The index of refraction of the layer of silicon oxynitride is selected in accordance with its thickness to produce a desired thickness of the layer of silicon dioxide after completion of oxidation of the openings in which the dielectric isolation barrier is formed. the index of refraction of silicon oxynitride is preferably between 1.55 and 1.70.

19 Claims, 11 Drawing Figures

METHOD FOR CONTROLLING DIELECTRIC ISOLATION OF A SEMICONDUCTOR DEVICE

In the manufacture of semiconductor devices, it is desired to be able to dielectrically isolate material. The electrical connections between these active and passive devices, which are integrated circuit components, are usually made through an electrical insulating layer on the surface of the semiconductor block of material.

Various means of dielectrically isolating each of the active and passive devices on a single semiconductor block of material from each other have been previously suggested. One has been to deposit a layer of silicon dioxide on the top surface of the substrate of silicon to function as a mask and then form openings in both the layer of silicon dioxide and the substrate. Then, the openings are oxidized to form the dielectric isolation barrier.

However, the use of a layer of silicon dioxide as the mask results in a very severe vertical penetration of oxygen during oxidation to produce a very thick layer of thermal silicon dioxide beneath the mask of silicon dioxide. Since the formulation of this thick layer of thermal silicon dioxide underneath the mask of silicon dioxide is formed by converting silicon from the silicon substrate therebeneath to silicon dioxide, a substantial thickness of the silicon substrate is utilized so that its remaining thickness above the region forming the collector of a transistor, for example, may not be sufficient to have the base and emitter regions, for example, formed therein.

Another suggested way of producing dielectric isolation in a semiconductor body has been to utilize a layer of pure silicon nitride ($Si_3N_4$) as the protective mask. The openings are etched in the layer of silicon nitride and the silicon substrate. Then, thermal oxidation of the openings occurs. While the layer of silicon nitride prevents any lateral or vertical penetration of the silicon dioxide produced in the openings in the silicon substrate, it presents the problem of transistor defects due to relatively high stresses created on the underlying substrate by the silicon nitride at the interface between the silicon nitride and the substrate.

A further suggested manner of forming dielectric isolation in a semiconductor body has been to deposit a layer of silicon dioxide on the top surface of the silicon substrate and then deposit a layer of silicon nitride over the layer of silicon dioxide. The openings are then etched in the layer of silicon nitride, the layer of silicon dioxide, and the substrate. Of course, this produces an etching problem, particularly as to time, because of the three different materials requiring different etchants.

Furthermore, there is substantial lateral penetration of silicon dioxide from thermally oxidizing the openings beneath the layer of silicon dioxide. This lateral penetration is known as a "bird's beak" and produces mask alignment problems for further processing steps such as base and emitter diffusions, for example. Thus, instead of the isolation barrier being that defined by thermally oxidizing the openings, it is spread much wider so as to possibly have an effect on the size of a resistor to be formed within the isolation barrier, for example. It would have a similar effect upon the base and emitter regions to be formed within the isolation barrier, for example.

The present invention satisfactorily solves the foregoing problems while still obtaining the desired dielectric isolation barrier. With the method of the present invention, the "bird's beak" problem is eliminated so that precise alignment for further processing steps is not affected by the dielectric isolation barrier.

The present invention uses a protective mask or layer of silicon oxynitride ($SiO_xN_y$). When subjected to oxidation by an agent that attacks silicon in silicon oxynitride or pure silicon, the oxidation of the openings results in conversion of the entire layer of silicon oxynitride to silicon dioxide at the same time that there is formation of silicon dioxide in the openings. Therefore, the method of the present invention eliminates the necessity of etching away the protective mask as is necessary when silicon nitride is used, for example, since the layer of silicon oxynitride is changed into the electrical insulation layer of silicon dioxide on the suface of the substrate. Thus, an electrical insulating layer and a dielectric isolation barrier, which are homogeneous, are simultaneously produced.

Through controlling the index of refraction of silicon oxynitride and the thickness of the layer of silicon oxynitride, regulation is obtained of the amount of silicon removed from the silicon substrate during formation of silicon dioxide in the openings and conversion of the entire layer of silicon oxynitride to silicon dioxide. The thickness of the layer of silicon oxynitride is selected in conjunction with the index of refraction of silicon oxynitride so that the resulting thickness of the layer of silicon dioxide is sufficient to function as a mask for diffusion of the impurities for forming a base and an emitter in the epitaxial layer of a substrate, for example, and as an electrical insulating layer for the surface of the substrate. If boron is the impurity diffused to form the base, the thickness of the layer of silicon dioxide must be between 3,000 and 4,000 A. This thickness will not require removal of a substantial thickness of the substrate of silicon when converting the layer of silicon oxynitride to silicon dioxide while still providing the desired mask during base and emitter diffusions.

An object of this invention is to provide a method for forming a dielectric isolation barrier for an integrated circuit component of a semiconductor device.

Another object of this invention is to provide a method for controlling the growth of silicon dioxide for a dielectric isolation barrier for an integrated circuit component of a semiconductor device.

The foregoing and other objects, features, and advantages of the invention will be more apparent from the following more particular description of a preferred embodiment of the invention as illustrated in the accompanying drawings.

Figure 1A:
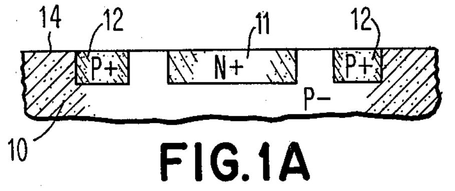
FIGS. 1A–1J are schematic sectional views showing the various steps in forming an NPN transistor by the method of the present invention.

Referring to the drawings and particularly FIG. 1A, there is shown a substrate 10 of P− type silicon in which an N+ region 11 and a P+ region 12, which surrounds the N+ region 11, are formed.

Each of the regions 11 and 12 is preferably formed by diffusion of an impurity through a protective mask (not shown) into top surface 14 of the substrate 10 in the well-known manner. The N+ region 11 is preferably formed by diffusing arsenic, and the P+ region 12 is preferably formed by diffusing boron. Other suitable examples of the impurity for forming the N+ region 11 include antimony and phosphorous. Another suitable example of the impurity for forming the P+ region 12 is gallium.

Each of the regions 11 and 12 is diffused at different times. Instead of diffusion, the regions 11 and 12 could be formed in the substrate 10 by other suitable means such as ion implantation, for example. The N+ region 11 is preferably formed first to aid in mask alignment although such is not a requisite.

Figure 1B:
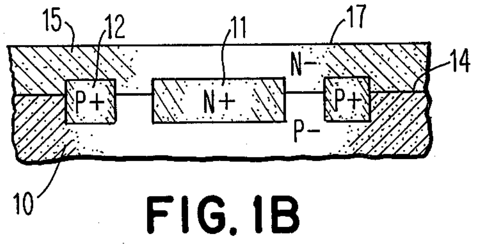

Upon completion of diffusion of the regions 11 and 12 into the substrate 10, the protective mask is removed and an epitaxial layer 15 (see FIG. 1B) is then grown on the surface 14 of the substrate 10 in which the regions 11 and 12 are formed. The epitaxial layer 15 is an N− type conductivity and may be grown in any suitable manner such as that shown and described in U.S. Pat. No. 3,424,629 to Ernst et al., for example.

The growth of the epitaxial layer 15 on the surface 14 of the substrate 10 causes the N+ region 11 and the P+ region 12 to move partially into the epitaxial layer 15 due to the elevated temperatures at which the epitaxial layer 15 is grown. Thus, the regions 11 and 12 are buried within the epitaxial layer 15.

Figure 1C:
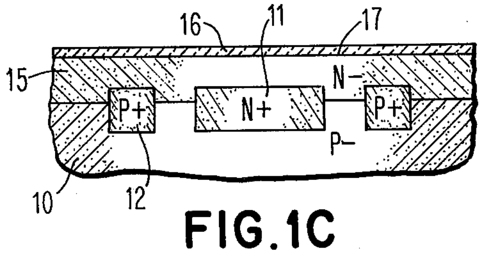

After the epitaxial layer 15 has been grown to the desired thickness, which is preferably 2 microns with the substrate 10 having a thickness of 17 mils, a layer 16 (see FIG. 1C) of silicon oxynitride ($SiO_xN_y$) is deposited on a surface 17 of the epitaxial layer 15. The thickness of the layer 16 of silicon oxynitride is determined by the thickness desired for the layer of silicon dioxide produced by conversion of the silicon oxynitride and the index of refraction of the deposited silicon oxynitride. This thickness of the layer of silicon dioxide is dependent upon the impurities to be diffused into the epitaxial layer 15.

Figure 2:
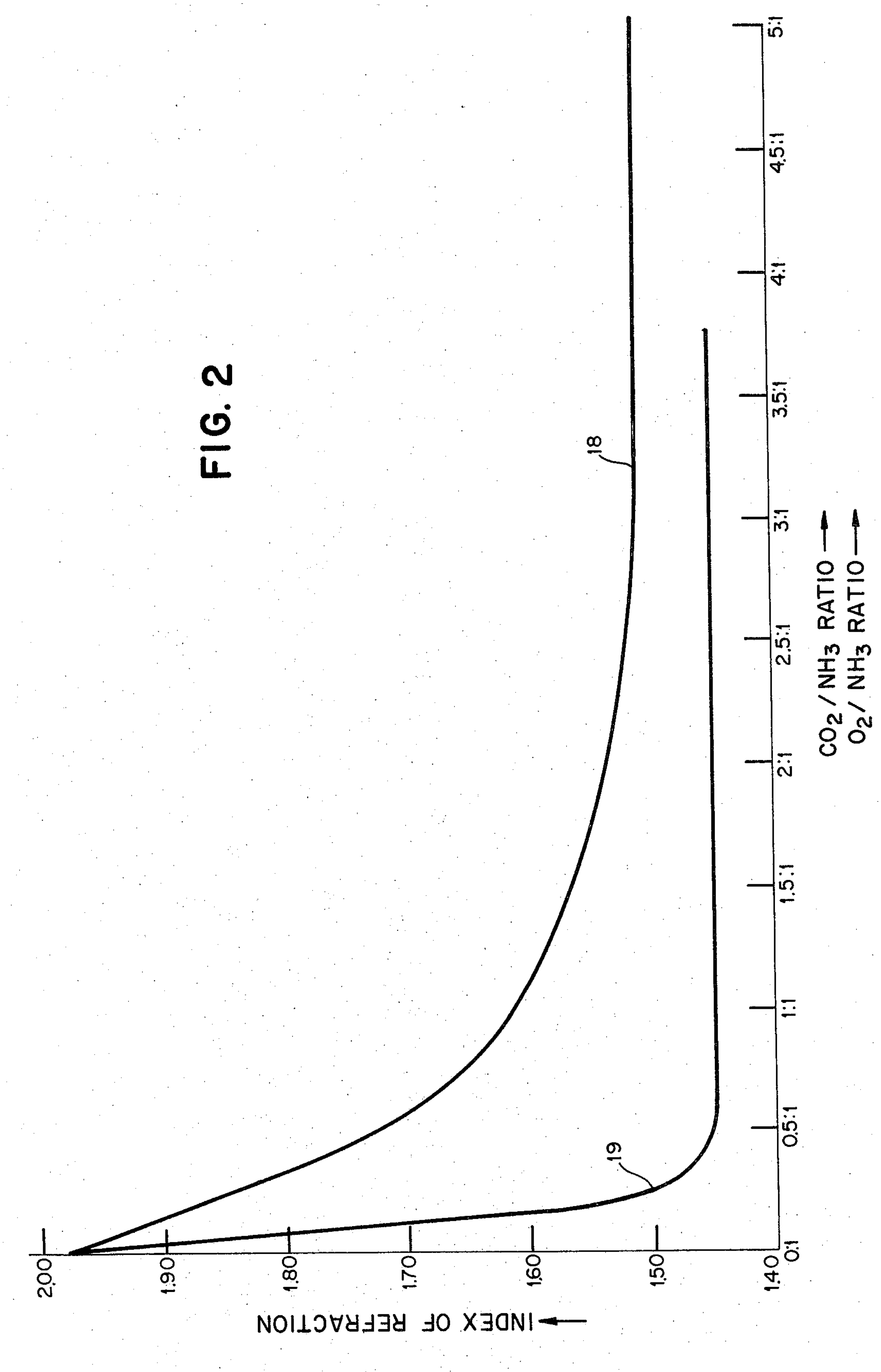
FIG. 2 is a graph having curves to show the relationship of the index of refraction of silicon oxynitride for two methods of depositing silicon oxynitride.

The layer 16 of silicon oxynitride is preferably deposited by the method described on page 3888 of the May 1973 (Volume 15, No. 12) issue of the IBM Technical Disclosure Bulletin. By controlling the ratio of carbon dioxide to ammonia in the method set forth in the IBM Technical Disclosure Bulletin, the index of refraction of the layer 16 of silicon oxynitride can be controlled so that it is preferably between 1.55 and 1.70. As shown in curve 18 in FIG. 2, increasing the ratio of carbon dioxide to ammonia decreases the index of refraction.

The index of refraction of silicon oxynitride varies directly as the density. Thus, an increase in the index of refraction of silicon oxynitride produces an increase in the density of silicon oxynitride.

As the density of silicon oxynitride increases, penetration of oxygen through a layer of silicon oxynitride of a specific thickness is decreased. Therefore, by increasing the index of refraction, penetration of oxygen through the layer 16 of silicon oxynitride of a specific thickness is decreased. Likewise, a decrease in the index of refraction enables more oxygen to penetrate the layer 16 of silicon oxynitride of a specific thickness. Accordingly, control of the index of refraction of the layer 16 of silicon oxynitride enables complete conversion of the layer 16 of silicon oxynitride of a specific thickness to silicon dioxide during oxidation.

However, it should be understood that an increase in the thickness of the layer 16 of silicon oxynitride for a specific index of refraction also decreases penetration of oxygen therethrough. Thus, as the thickness of the layer 16 of silicon oxynitride is increased, its index of refraction can be decreased to produce the same penetration of oxygen therethrough. Accordingly, to produce complete conversion of the layer 16 of silicon oxynitride to silicon dioxide of a specific thickness during oxidation, the thickness of the layer 16 of silicon oxynitride is selected in conjunction with its index of refraction so that complete conversion of silicon oxynitride to silicon dioxide occurs.

If silicon oxynitride were deposited by the reaction of oxygen with ammonia and silane rather than the reaction of carbon dioxide with ammonia and silane, it is not possible to obtain precise control of the index of refraction of silicon oxynitride in the desired range of 1.55 to 1.70. This is shown by curve 19 in FIG. 2.

Figure 1D:
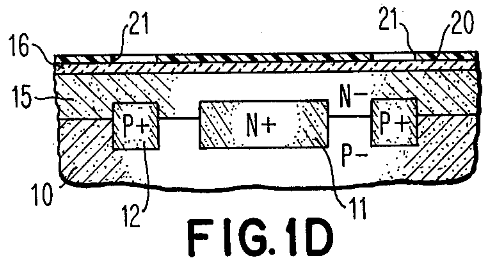

After the layer 16 of silicon oxynitride has been deposited on the surface 27 of the epitaxial layer 15, a mask 20 (see FIG. 1D) of photoresist material is deposited on the layer 16 of silicon oxynitride. The photoresist mask 20 then has holes 21 formed therein by a developer in the well-known manner.

Figure 1E:
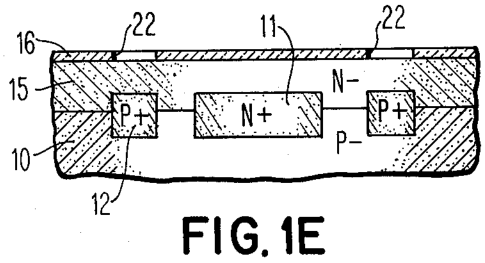

After the holes 21 have been formed in the photoresist mask 20, the layer 16 of silicon oxynitride has openings 22 (see FIG. 1E) etched therein through the holes 21 in the mask 20. The openings 22 are aligned over the P+ region 12 so that a continuous opening surrounding the area having the N+ region 11 is formed. After the holes 22 have been formed in the layer 16 of silicon oxynitride by a suitable etchant such as a buffered solution of hydrofluoric acid or a hot phosphoric salt, for example, the photoresist mask 20 is removed by a hot sulphuric nitric mixture, for example.

Figure 1F:
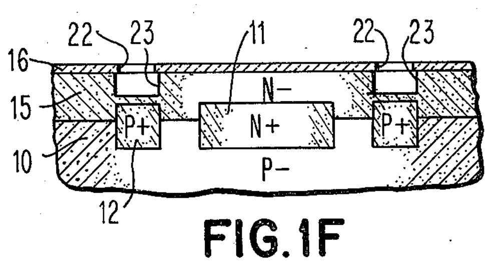

After the photoresist mask 20 has been removed, openings 23 (see FIG. 1F) are etched in the epitaxial layer 15 in alignment with the P+ region 12. The openings 23 are etched by a suitable etchant such as a mixture of acetic acid, nitric acid, and hydrofluoric acid, for example.

With the openings 22 in the layer 16 of silicon oxynitride aligned with the openings 23 in the epitaxial layer 15, oxidation then occurs through placing the substrate 10 in an oxidizing atmosphere in an elevated temperature with or without the addition of water vapor to the oxidation atmosphere. While thermal oxidation is preferred, any means of oxidizing may be employed having an oxidizing agent that attacks both the silicon in the layer 16 of silicon oxynitride and the silicon in the epitaxial layer 15.

Figure 1G:
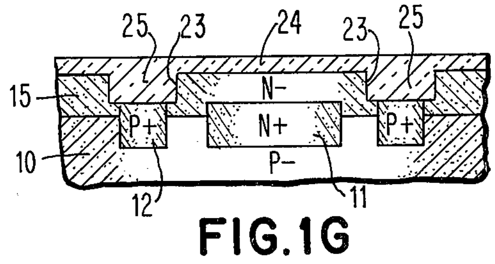

As shown in FIG. 1G, a layer 24 of silicon dioxide is formed on the epitaxial layer 15 through conversion of the layer 16 of silicon oxynitride to silicon dioxide. The production of the layer 24 of silicon dioxide also removes a portion of the epitaxial layer 15 since silicon dioxide is formed from the epitaxial layer 15 beneath the layer 16 of silicon oxynitride as well as from the layer 16 of silicon oxynitride.

The holes 23 in the epitaxial layer 15 are filled with portions 25 of silicon dioxide extending downwardly from the layer 24 of silicon dioxide. The portions 25 of silicon dioxide within the openings 23 in the epitaxial layer 15 are homogeneous with the layer 24 of silicon dioxide and integral therewith so as to be continuous. The portions 25 of silicon dioxide reach through the epitaxial layer 15 to the P+ region 12 so that a dielectric isolation barrier is formed around the N+ region 11. Accordingly, the P+ region 12 and the portions 25 of silicon dioxide cooperate to form a dielectric and junction isolation barrier for the N+ region 11.

Figure 1H:
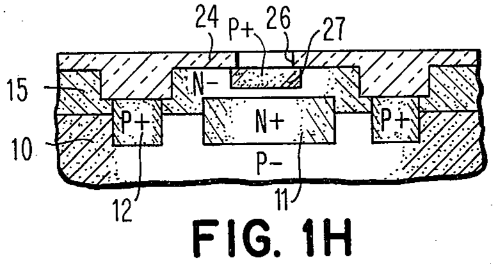

After the formation of the layer 24 of silicon dioxide on the epitaxial layer 15, a hole 26 (see FIG. 1H) is etched in the layer 24 of silicon dioxide above the N+ region 11 to enable diffusion of an impurity therethrough to form a P+ region 27 in the epitaxial layer 15. The thickness of the layer 24 of silicon dioxide is selected in accordance with the impurity to be diffused through the opening 26 to form the P+ region 27, which functions as a base region of an NPN transistor.

When boron is utilized as the impurity, the thickness of the layer 24 of silicon dioxide should be between 3,000 and 4,000 A. For other impurities, the thickness of the layer 24 of silicon dioxide would be varied accordingly. Thus, the impurity, which is utilized to form the P+ region 27, determines the thickness of the layer 16 of silicon oxynitride since the thickness of the layer 16 of silicon oxynitride in conjunction with the index of refraction of the silicon oxynitride forming the layer 16 produce the desired thickness of the layer 24 of silicon dioxide for the particular impurity.

After the P+ region 27 has been formed in the epitaxial layer 15, the opening 26 is closed by thermal oxidation. The closing of the opening 26 in the layer 24 of silicon dioxide by thermal oxidation results in about 2,000 A of silicon dioxide being disposed over the P+ region 27 in the epitaxial layer 15 and about 700 A being added over the layer 24 of silicon dioxide.

Figure 1I:
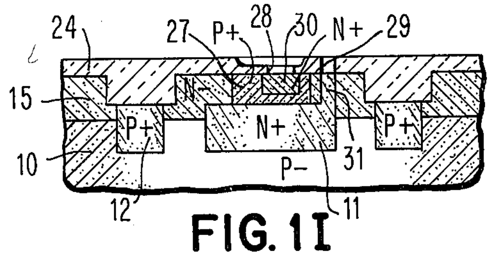

Then, an opening 28 (see FIG. 1I), which is much smaller than was the opening 26, is etched in the layer 24 of silicon dioxide above the P+ region 27, and an opening 29 also is etched in the layer 24 of silicon dioxide above a portion of the N+ region 11. After the openings 28 and 29 are formed in the layer 24 of silicon dioxide, an N+ region 30 is formed in the P+ region 27 by diffusing an impurity, which is preferably the same as the impurity used in forming the N+ region 11, through the opening 28 in the layer 24 of silicon dioxide, and an N+ region 31 is formed by diffusing an impurity, which is preferably the same as the impurity used in forming the N+ region 11, through the opening 29 in the layers 24 of silicon dioxide. The N+ region 30 is the emitter of an NPN transistor formed by the N+ region 11, the P+ region 27, and the N+ region 30. The N+ region 31 is the collector contact.

Figure 1J:
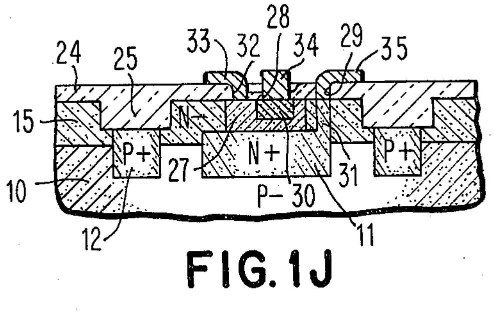

After diffusion of the N+ regions 30 and 31, an opening 32 (see FIG. 1J) is etched in the layer 24 of silicon dioxide with the openings 32 aligned with the P+ region 27, which is the base. Metal such as aluminum, for example, is next deposited over the layer 24 of silicon dioxide and into the openings 28, 29, and 32 to make ohmic contact with the N+ region 30, the N+ region 31, and the P+ region 27, respectively. The metal is then eteched to form a base electrode 33, and emitter electrode 34, and a collector electrode 35 as shown in FIG. 1J.

While the present invention has shown and described an NPN transistor as being formed within the dielectric isolation barrier, it should be understood that a PNP transistor could be dielectrically isolated. Of course, this would necessitate the substrate 10 and the epitaxial layer 15 being of opposite conductivity types to their present conductivity types. It also should be understood that there are a plurality of the various integrated components formed on the substrate 10 with each of the integrated circuit components being dielectrically isolated from the others although only one has been shown and described.

While the present invention has shown and described the dielectric isolation barrier as dielectrically isolating a bipolar transistor, it should be understood that any active or passibe integrated circuit component could be isolated by the method of the present invention. Thus, a resistor could be dielectrically isolated as could FETs such as N channel and P channel devices of complimentary MOS technology, for example. Thus, the method and devices produced by the method of the present invention are not limited to bipolar transistors.

While the present invention has shown and described various P+ and N+ regions as being formed by diffusion, it should be understood that any other manner of implanting impurities in a semiconductor body could be employed. For example, ion implantation could be utilized. With ion implantation used for forming the regions 11 and 12, the impurities could be controlled so that the regions 11 and 12 were only within the epitaxial layer 15, for example, if such were desired.

Additional, if the N+ region 11 were only in the epitaxial layer 15, it would not be necessary for the P+ region 12 to be employed as the portions 25 of silicon dioxide could extend completely through the epitaxial layer 15. Thus, it is not mandatory that the dielectric isolation barrier of the present invention include the P+ region 12.

When antimony is employed as the impurity for diffusing the N+ region 11, the P+ region 12 is not required. This is because the epitaxial layer 15 can be thinner and the silicon dioxide portion 25 can reach through the epitaxial layer 15 to the substrate 10.

While the present invention has shown and described a semiconductor body of silicon being formed by the substrate 10 and the epitaxial layer 15, it should be understood that the method and device of the present invention do not require the semiconductor body to include the epitaxial layer 15. Thus, the semiconductor body could be formed solely by the substrate 10 if desired.

Tests were conducted on four different films deposited on a surface of a silicon substrate, which did not have an epitaxial layer, to determine the stresses, $S_x$ and $S_y$, created in the $x$ and $y$ directions and the total stress, S, on the substrate by each of the films. The four films were silicon nitride, silicon oxynitride with an index of refraction of 1.52, silicon oxynitride with an index of refraction of 1.63, and silicon oxynitride with an index of refraction of 1.74. The table hereinbelow shows the results thereof:

| Film | $SiO_xN_y$ with index of refraction of 1.52 | $SiO_xN_y$ with index of refraction of 1.63 | $SiO_xN_y$ with index of refraction of 1.74 | $Si_3N_4$ |
|---|---|---|---|---|
| Thickness (A) | 970 | 890 | 700 | 1000 |
| $S_x$ (dynes/cm²) | 7.4×10⁸ C | 1.25×10¹⁰ C | 9.5×10⁹ C | 1.03×10¹⁰ T |
| $S_y$ (dynes/cm²) | 6.9×10⁸ T | 7.6×10⁹ C | 1.05×10¹⁰ C | 1.40×10¹⁰ T |
| $S_{total}$ (dynes/cm²) | 2.5×10⁷ C | 9.98×10⁹ C | 1.01×10¹⁰ C | 1.22×10¹⁰ T |

In the table, C represents compressive stress and T represents tensile stress.

While the index of refraction is preferably in the range between 1.55 and 1.70, it should be understood that the index of refraction is not limited to this range but can be any index of refraction to produce the desired thickness of the layer 24 of silicon dioxide from the layer 16 of silicon oxynitride when thermal oxidation of the openings 23 occurs. Of course, the index of refraction must not be so high as to create an undesirable stress on the substrate 10.

An advantage of this invention is that all of a layer of silicon oxynitride can be converted to silicon dioxide so there is no need to remove the silicon oxynitride by etching as is required when silicon nitride is used as a mask. Another advantage of this invention is that it eliminates the "bird's beak" created by using layers of silicon nitride and silicon dioxide whereby there is no problem of mask alignment as is created by the "bird's beak." A further advantage of this invention is that it does not create stresses at the interface with the substrate of such magnitude as to damage the substrate as can silicon nitride.

While the invention has been particularly shown and described with reference to a preferred embodiment thereof, it will be understood by those skilled in the art that various changes in form and details may be made therein without departing from the spirit and scope of the invention.

What is claimed is:

1. A method for fabricating a laterally isolated semiconductor device comprising:

depositing a layer of silicon oxynitride on a surface of a body of silicon;

forming communicating openings in the layer of silicon oxynitride and the body in laterally surrounding relation to a portion of the body;

oxidizing the openings in the layer of silicon oxynitride and the body to form a laterally surrounding dielectric isolation barrier of silicon dioxide in the body while simultaneously converting the layer of silicon oxynitride to a layer of silicon dioxide on the surface of the body;

selecting the index of refraction of silicon oxynitride in conjunction with the thickness of the layer of silicon oxynitride to produce the layer of silicon dioxide of a desired thickness;

and forming an integrated circuit component in the body within the laterally surrounding dielectric isolation barrier.

2. The method according to claim 1 in which:

an epitaxial layer is deposited on the surface of a substrate of silicon to form the body;

the layer of silicon oxynitride is deposited on the surface of the epitaxial layer;

the communicating openings are formed in the layer of silicon oxynitride and the epitaxial layer;

and the integrated circuit component is formed in the epitaxial layer within the laterally surrounding dielectric isolating barrier.

3. The method according to claim 2 in which:

a region of a conductivity type opposite to that of the substrate is formed in the epitaxial layer to form a buried region located at least within the epitaxial layer;

and the openings in the layer of silicon oxynitride and the epitaxial layer are formed in laterally surrounding relation to the region of opposite conductivity within the epitaxial layer.

4. The method according to claim 3 including:

forming the region of conductivity type opposite to that of the substrate within the substrate;

and then growing the epitaxial layer on the surface of the substrate having the region in a manner to cause a movement of impurities of the region into the epitaxial layer during its growth to produce an effective extension of the region into the epitaxial layer to form a buried region located partially within the substrate and the epitaxial layer.

5. The method according to claim 4 in which the layer of silicon oxynitride has an index of refraction no greater than 1.70.

6. The method according to claim 5 in which the layer of silicon oxynitride has an index of refraction between 1.55 and 1.70.

7. The method according to claim 3 including:

forming the region of conductivity type opposite to that of the substrate within the substrate and a region of the same conductivity type as the substrate within the substrate and laterally surrounding the region of opposite conductivity type;

then growing the epitaxial layer of a conductivity type opposite to that of the substrate on the surface of the substrate having the regions formed therein in a manner to cause a movement of impurities of the regions into the epitaxial layer during its growth to produce an effective extension of each of the regions into the epitaxial layer to form buried regions located partially within the substrate and the epitaxial layer;

forming the openings in the layer of silicon oxynitride and the epitaxial layer in the areas over the region of the same conductivity type as the substrate;

and forming a laterally surrounding isolation barrier in the epitaxial layer of both silicon dioxide as the dielectric isolation barrier and the region of the same conductivity type as the substrate as a junction isolation barrier through the silicon dioxide engaging the top of the region of the same conductivity type as the substrate.

8. The method according to claim 7 in which the layer of silicon oxynitride has an index of refraction no greater than 1.70.

9. The method according to claim 8 in which the layer of silicon oxynitride has an index of refraction between 1.55 and 1.70.

10. The method according to claim 3 including: depositing the epitaxial layer with a conductivity type opposite to that of the substrate;

forming a region of the same conductivity type as the substrate within the epitaxial layer in laterally surrounding relation to the region of conductivity type opposite to that of the substrate to form a second buried region located at least in the epitaxial layer;

forming the openings in the layer of silicon oxynitride and the epitaxial layer in the areas over the second buried region;

and forming a laterally surrounding isolation barrier of both silicon dioxide as the dielectric isolation barrier and the second buried region as a junction isolation barrier through the silicon dioxide engaging the top of the second buried region.

11. The method according to claim 10 in which the layer of silicon oxynitride has an index of refraction no greater than 1.70.

12. The method according to claim 11 in which the layer of silicon oxynitride has an index of refraction between 1.55 and 1.70.

13. The method according to claim 2 in which the layer of silicon oxynitride has an index of refraction no greater than 1.70.

14. The method according to claim 13 in which the layer of silicon oxynitride has an index of refraction begreater than 1.70.

16. The method according to claim 15 in which the layer of silicon oxynitride has an index of refraction between 1.55 and 1.70.

17. The method according to claim 2 in which the epitaxial layer is of a conductivity type opposite to that of the substrate.

18. The method according to claim 3 in which the epitaxial layer is of a conductivity type opposite to that of the substrate.

19. The method according to claim 4 in which the ep-